(12) United States Patent
Sato et al.

(10) Patent No.: US 10,082,929 B2
(45) Date of Patent: Sep. 25, 2018

(54) WORKING PROCESS PROCESSING SYSTEM AND WORKING PROCESS PROCESSING METHOD

(71) Applicant: Kabushiki Kaisha Toshiba, Minato-ku (JP)

(72) Inventors: Tatsuya Sato, Yokohama (JP); Yasunori Nakashima, Yokohama (JP); Taku Orihara, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 435 days.

(21) Appl. No.: 14/793,188

(22) Filed: Jul. 7, 2015

(65) Prior Publication Data
US 2016/0018967 A1 Jan. 21, 2016

(30) Foreign Application Priority Data

Jul. 15, 2014 (JP) .................. 2014-145347

(51) Int. Cl.
*G06F 17/50* (2006.01)
*G06F 3/0481* (2013.01)
(Continued)

(52) U.S. Cl.
CPC ........ *G06F 3/04817* (2013.01); *G06F 3/0484* (2013.01); *G06F 17/5009* (2013.01);
(Continued)

(58) Field of Classification Search
CPC .......... G05B 2219/32254; G05B 2219/32351; G06F 17/5009; Y02P 90/26; G06T 19/00
See application file for complete search history.

(56) References Cited

U.S. PATENT DOCUMENTS

2007/0011101 A1* 1/2007 Kidera ............... G06Q 20/3829
705/71
2013/0159887 A1* 6/2013 Whitmyer, Jr. ..... G06F 17/3089
715/760
(Continued)

FOREIGN PATENT DOCUMENTS

EP 2 620 827 A2 7/2013
JP 2001-134781 5/2001
(Continued)

OTHER PUBLICATIONS

Extended European Search Report dated Dec. 18, 2015 in the corresponding European Application No. 15175606.1.

*Primary Examiner* — Justin S Lee
(74) *Attorney, Agent, or Firm* — Oblon, McClelland, Maier & Neustadt, L.L.P.

(57) ABSTRACT

A working process processing system of an embodiment has: a 3D data storage for storing the 3D data; a working process data storage to store the working process data; an animation data processor to process animation data based on the 3D data stored in the 3D data storage and the working process data stored in the working process data storage, the animation data comprising displaying data showing a plurality of changing situations of the working processes; wherein the animation data processor is configured to include the comment information relating to the work attribute information of at least one of the working processes with the displaying data of the respective working process of the animation data processed thereof.

7 Claims, 9 Drawing Sheets

| comment ID | comment | ATTRIBUTE: HEAVY OBJECT | | | | ... | | ... | | working process m | | ... | |
|---|---|---|---|---|---|---|---|---|---|---|---|---|---|
| | | working process b | | working process a | | | | | | | | | |
| | | view point | adoption ratio | view point | adoption ratio | view point | adoption ratio | view point | adoption ratio | view point | adoption ratio | view point | adoption ratio |
| A001 | Don't stand under hung object. | v11 | 0.8 | v21 | 0.2 | ... | ... | ... | ... | vm1 | pm1 | ... | ... |
| A002 | Confirm slinging. | v12 | 0.4 | v22 | 0.75 | ... | ... | ... | ... | vm2 | pm2 | ... | ... |
| A003 | Confirm permissible weight. | | | | | | | | | | | ... | ... |
| | | | | | | | | | | | | | |
| ... | ... | | | | | | | | | | | ... | ... |
| | | | | | | | | | | | | | |
| Annn | ... | v1n | p1n | v2n | p2n | | | | | vmn | pmn | ... | ... |
| ... | ... | ... | ... | ... | ... | ... | ... | ... | ... | ... | ... | ... | ... |

(51) Int. Cl.
*G06Q 10/06* (2012.01)
*G06T 13/00* (2011.01)
*G06F 3/0484* (2013.01)

(52) U.S. Cl.
CPC ........... *G06Q 10/06* (2013.01); *G06Q 10/067* (2013.01); *G06Q 10/0633* (2013.01); *G06T 13/00* (2013.01)

(56) References Cited

U.S. PATENT DOCUMENTS

| | | |
|---|---|---|
| 2013/0191094 A1 | 7/2013 | Akahoshi et al. |
| 2014/0003567 A1 | 1/2014 | Sato et al. |

FOREIGN PATENT DOCUMENTS

| | | |
|---|---|---|
| JP | 2003-223094 | 8/2003 |
| JP | 2003-295939 | 10/2003 |
| JP | 2006-040194 | 2/2006 |
| JP | 2006-172197 A | 6/2006 |
| JP | 2011-134098 | 7/2011 |
| JP | 2011-253422 | 12/2011 |
| JP | 2014-10080 A | 1/2014 |

* cited by examiner

FIG. 8

ATTRIBUTE: HEAVY OBJECT

| comment ID | comment | working process b | | working process a | | ... | | working process m | | ... | |
|---|---|---|---|---|---|---|---|---|---|---|---|
| | | view point | adoption ratio | view point | adoption ratio | view point | adoption ratio | view point | adoption ratio | view point | adoption ratio |
| A001 | Don't stand under hung object. | v11 | 0.8 | v21 | 0.2 | ... | ... | vm1 | pm1 | ... | ... |
| A002 | Confirm slinging. | v12 | 0.4 | v22 | 0.75 | ... | ... | vm2 | pm2 | ... | ... |
| A003 | Confirm permissible weight. | | | | | | | | | | |
| | | | | | | | | | | | |
| ... | ... | | | | | | | | | ... | ... |
| | | | | | | | | | | | |
| Annn | ... | v1n | p1n | v2n | p2n | ... | ... | vmn | pmn | ... | ... |
| ... | ... | | | ... | ... | | ... | ... | ... | ... | ... |

FIG. 9

| working process | category | attribute | comment ID | view point | display position |
|---|---|---|---|---|---|
| working process a | safety points | heavy object | A001 | v11 | d11 |
| | | | A004 | v14 | d14 |
| | | | A013 | | |
| | | | A015 | | |
| | | safety belt | B009 | | |
| | | | B013 | | |
| | working points | hanging center | C004 | | |
| | | | C016 | | |
| | | | ... | | |
| | ... | | | | |
| | design information | design values | D001 | | |
| | | | D002 | | |
| | | | D003 | | |
| | ... | | | | |
| working process b | safety points | heavy object | A002 | | |
| | | | A006 | | |
| | | | A010 | | |
| | | | A015 | | |
| | | safety belt | B008 | | |
| | | | B019 | | |
| | working points | hanging center | C003 | | |
| | | | C018 | | |
| | | | ... | | |
| | ... | | | | |
| | design information | design values | D011 | | |
| | | | D012 | | |
| | | | D013 | | |
| | ... | | | | |
| working process c | ... | | | | |

WORKING PROCESS PROCESSING SYSTEM AND WORKING PROCESS PROCESSING METHOD

CROSS-REFERENCE TO RELATED APPLICATION

This application is based upon and claims the benefit of priority from Japanese Patent Application No. 2014-145347, filed Jul. 15, 2014; the entire content of which is incorporated herein by reference.

FIELD

Embodiments of the present invention relate to a working process display system and working process display method which include a three-dimensional displaying based on three-dimensional data.

BACKGROUND

In a construction instruction manual that is used at various kinds of working process at a nuclear power plant, for example, such as installation work, disassembly, inspection, and restoration work, many are written in texts, such as work flow, work procedures, important matters needed for each work procedure, precaution statements, and safety matters. Based on the information, equipment outline drawings, working drawings, and photos are added when an experienced worker judges them to be necessary. An additional explanation is given to workers when necessary before and during each working process, so that the workers can understand what they are going to do. Information needed for working process is constantly added or supplemented to go ahead with the work. Furthermore, in the field, before and during work, the knowledge, past experiences, and technical construction know-how of experienced workers, and other contents and information that are not written in construction instruction manuals are added and supplemented through oral communications, construction documents, and the like. Thus, construction work can be carried out smoothly without any problem.

Meanwhile, as a field work management system, a management system that uses computers has been known as disclosed in Japanese Patent Application Laid-Open Publication No. 2006-40194 (the entire content of which is incorporated herein by reference).

A plant maintenance support system that uses a 3D CAD (three dimensional computer aided design) model has also been known as disclosed in Japanese Patent Application Laid-Open Publication No. 2003-295939 (the entire content of which is incorporated herein by reference).

BRIEF DESCRIPTION OF THE DRAWINGS

FIG. 8 is a conceptual diagram showing an example of comment information that is stored in such a way as to be linked to each attribute;

FIG. 9 is a conceptual diagram showing an example of comment data that is generated inside the working process display system.

DETAILED DESCRIPTION

Figure 1:
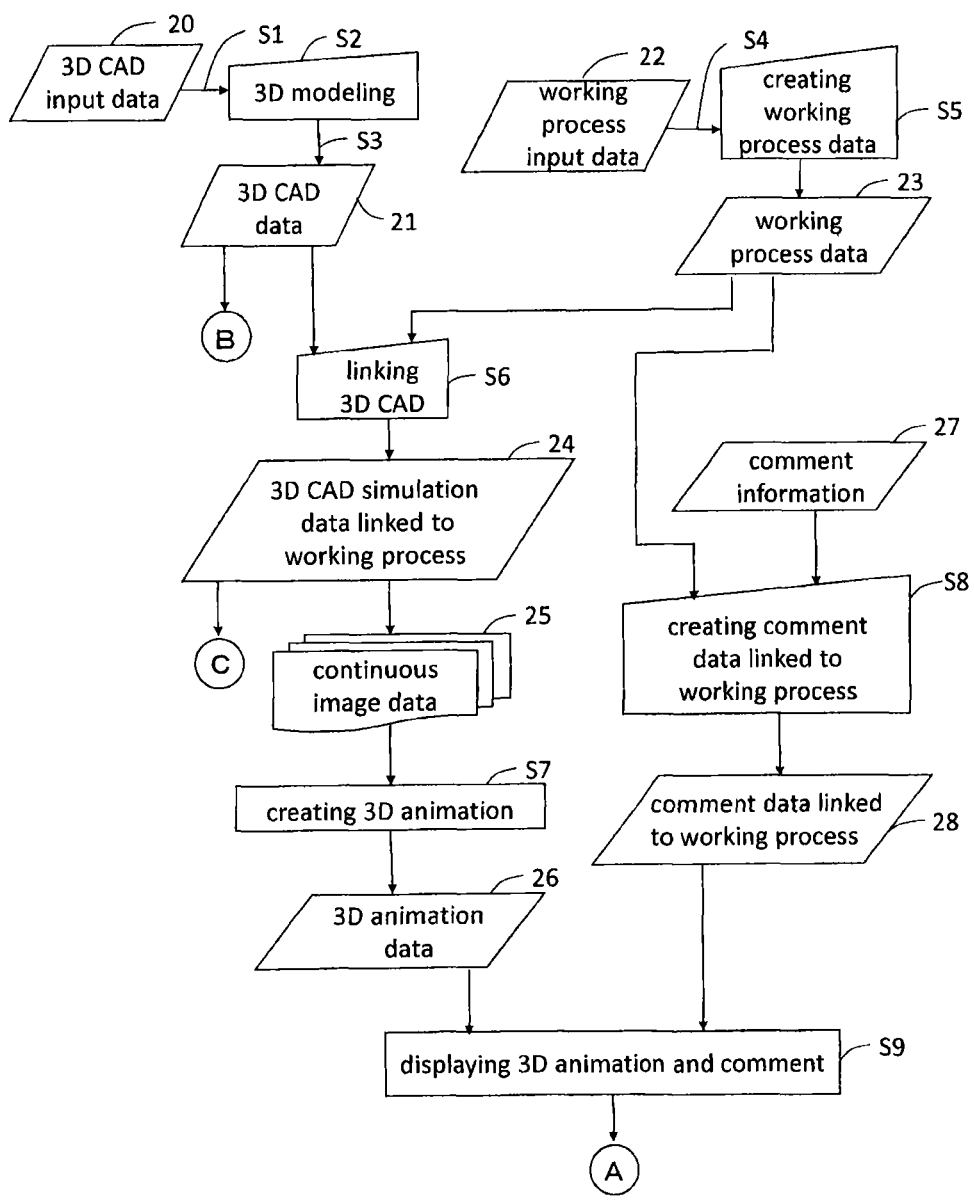
FIG. 1 is a flowchart schematically showing a part of a processing flow in a working process display system according to an embodiment of the present invention.

Due to the aging of experienced workers, the number of workers that can be considered skilled persons or experienced experts who have experience in the work is on the decline. It is becoming difficult to pass down construction techniques to next generations, and this raises concern that problems at the construction work would increase accordingly.

Therefore, the object of embodiments of the present invention is to enable inexperienced workers to accurately understand operation-target equipment and easily understand details of work procedures, important points of work, and the like.

According to an embodiment, there is provided a working process processing system comprising: a three-dimensional data receiver configured to accept three-dimensional data, the three-dimensional data comprising a three-dimensional shape of a work-target object; a three-dimensional data storage configured to store the three-dimensional data accepted at the three-dimensional data receiver; a working process receiver configured to accept working process data which defines a procedure of a plurality of working processes relating to the work-target object, the working process data contains work attribute information of each of the plurality of working processes; a comment information receiver configured to accept comment information relating to the work attribute information; a working process data storage configured to store the working process data accepted at the working process receiver; and an animation data processor configured to process animation data based on the three-dimensional data stored in the three-dimensional data storage and the working process data stored in the working process data storage, the animation data comprising displaying data showing a plurality of changing situations of the working processes; wherein the animation data processor is configured to include the comment information relating to the work attribute information of at least one of the working processes with the displaying data of the respective working process of the animation data processed thereof.

According to another embodiment, there is provided a working processing method comprising: a three-dimensional data receiving step of accepting three-dimensional data comprising a three-dimensional shape of a work-target object; a three-dimensional data storage step of storing the three-dimensional data accepted with the three-dimensional data receiving step; a working process receiving step of accepting working process data which defines a procedure of a plurality of working processes relating to the work-target object, the working process data contains work attribute information of each of the plurality of working processes; a comment information receiving step of accepting comment information relating to the work attribute information; and an animation data processing step of processing animation data based on the three-dimensional data stored in the three-dimensional data storage step and the working process data accepted in the working process receiving step, the animation data comprising displaying data showing a plurality of changing situations of the working processes; wherein the animation data processing step is configured to include the comment information relating to the work attribute information of at least one of the working processes with the displaying data of the respective working process of the animation data processed thereof.

Hereinafter, embodiments of a working process display system and processing flow thereof of the present invention will be described with reference to the accompanying drawings. The embodiments described below are given for illustrative purposes only, and not intended to limit the scope of the invention.

Figure 2:
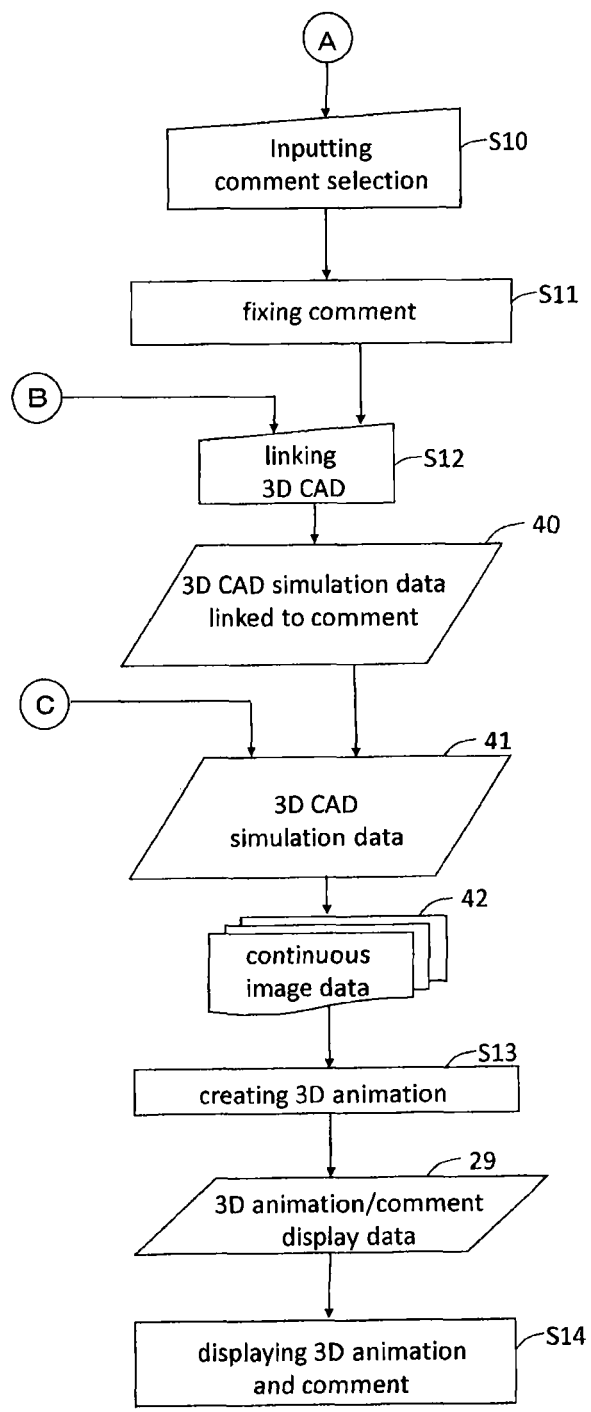
FIG. 2 is a flowchart showing another part of the processing flow which follows that of FIG. 1.
Figure 3:
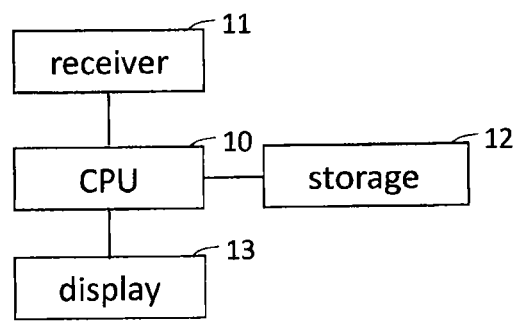
FIG. 3 is a block diagram showing the hardware configuration of the working process display system according to the embodiment of the present invention.
Figure 4:
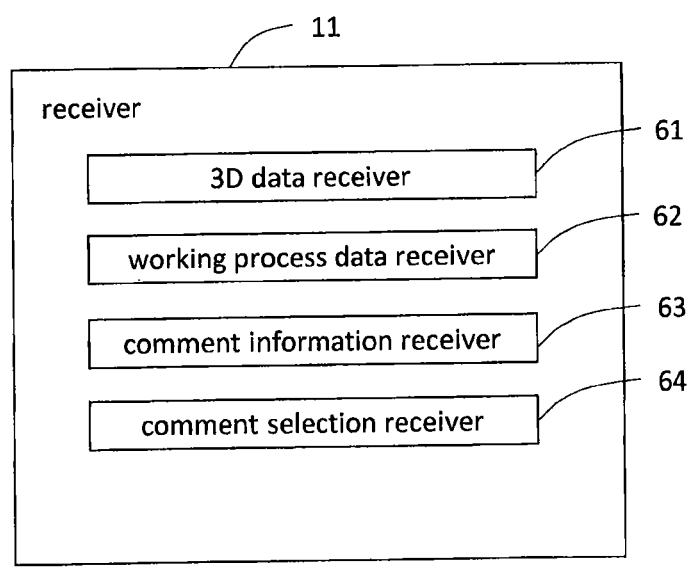
FIG. 4 is a block diagram showing the functional configuration of a receiver of the working process display system according to the embodiment of the present invention.
Figure 5:
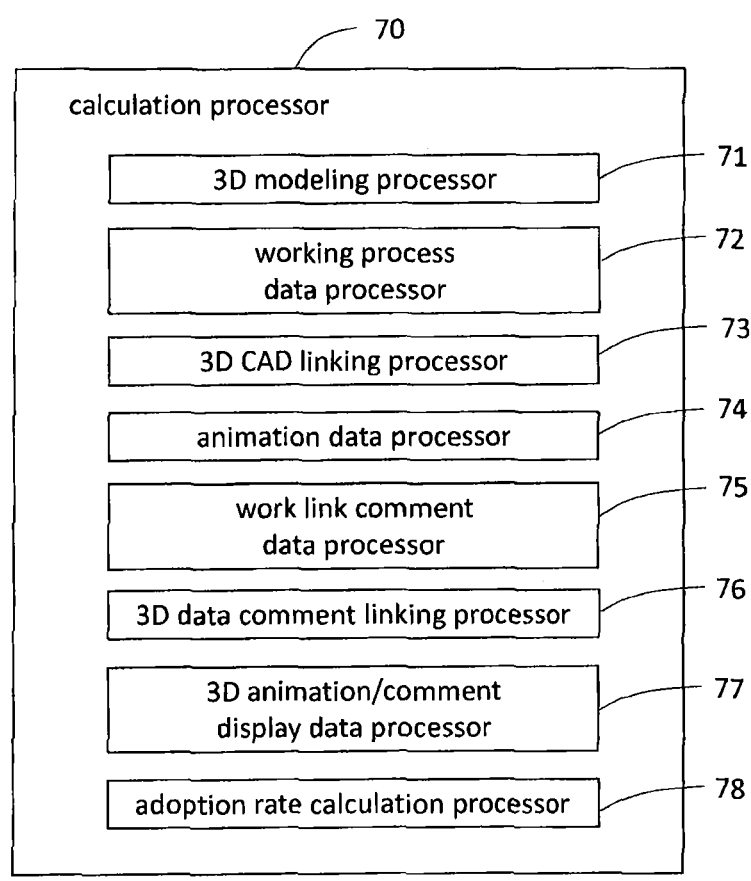
FIG. 5 is a block diagram showing the functional configuration of a calculation processor of the working process display system according to the embodiment of the present invention.
Figure 6:
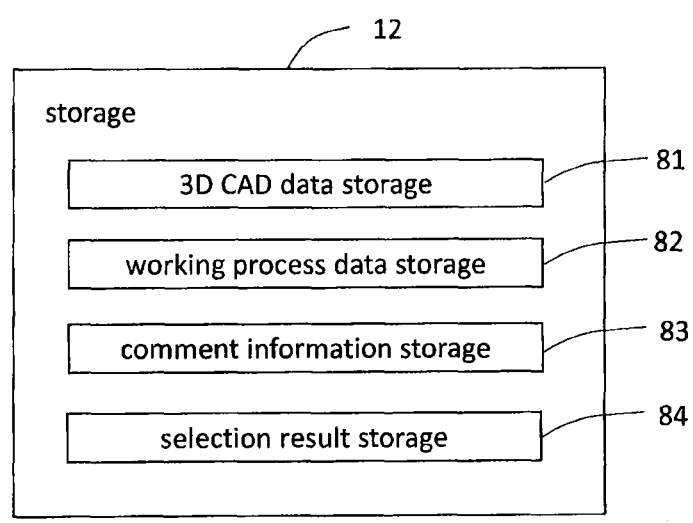
FIG. 6 is a block diagram showing the functional configuration of a storage of the working process display system according to the embodiment of the present invention.

FIG. 1 is a flowchart schematically showing a part of a processing flow in a working process display system according to an embodiment of the present invention. FIG. 2 is a flowchart showing another part of the processing flow which follows that of FIG. 1. FIG. 3 is a block diagram showing the hardware configuration of the working process display system according to the embodiment of the present invention. FIG. 4 is a block diagram showing the functional configuration of a receiver of the working process display system according to the embodiment of the present invention. FIG. 5 is a block diagram showing the functional configuration of a calculation processor of the working process display system according to the embodiment of the present invention. FIG. 6 is a block diagram showing the functional configuration of a storage of the working process display system according to the embodiment of the present invention.

As shown in FIG. 3, the working process display system of the present embodiment is realized by an electronic computer. As hardware components, the working process display system includes a central processing unit (CPU) 10, a receiver 11, a storage 12, and a display 13. The central processing unit (CPU) 10 includes an electronic circuit that can execute predetermined program codes. The central processing unit (CPU) 10 may be configured as a unit or a computer that is realized by hardware processing with the use of an electronic circuit such as ASIC (application specific integrated circuit), or may be configured as a unit or a computer that is realized by a combination of software and hardware processing.

The receiver 11 can be realized as a device that directly receives an input, such as a keyboard or a switch, as a connector that receives an input signal, or as hardware such as an interface that uses an electronic circuit. Alternatively, the receiver 11 may be realized by an electronic circuit executing predetermined program codes, such as a processor. The receiver 11 is not limited to software processing; the receiver 11 may be, for example, configured as a unit or a computer that is realized by hardware processing with the use of an electronic circuit such as ASIC, or may be configured as a unit or a computer that is realized by a combination of software and hardware processing.

The storage 12 can be realized by a storage device, such as a semiconductor memory or a hard disk. The display 13 is realized as a display such as CRT (cathode ray tube) or an LCD (liquid crystal display), as a connector that outputs a signal, or as hardware such as an interface that uses an electronic circuit. Alternatively, the storage 12 may be realized by an electronic circuit that executes predetermined program codes, such as a processor. The storage 12 is not limited to software processing; the storage 12 may be for example configured as a unit or a computer that is realized by hardware processing with the use of an electronic circuit such as ASIC, or may be configured as a unit or a computer that is realized by a combination of software and hardware processing.

The working process display system is designed to display, on the display 13, detailed work procedures of working processes as three-dimensional animations. At the same time, the working process display system is designed to display comment information, such as precaution statements that workers have to pay attention to before each working process. Furthermore, the comments to be displayed can be selected based on the knowledge, experiences, and skills of an actual worker. Accordingly, the working process display system can display the equivalent of an operation instruction manual, which was conventionally written on paper, in a more easy-to-understand manner.

As shown in FIG. 4, among the functions of the receiver 11 are a three-dimensional data receiver 61, a working process data receiver 62, a comment information receiver 63, and a comment selection receiver 64.

As shown in FIG. 5, a calculation processor 70 includes a 3D (three-dimensional) modeling processor 71, a working process data processor 72, a 3D CAD (three dimensional computer aided design) linking processor 73, an animation data processor 74, a work link comment data processor 75, a 3D data comment linking processor 76, a 3D animation/comment display data processor 77, and an adoption ratio calculation processor 78. In this case, the calculation processor 70 is executed by the CPU 10.

As shown in FIG. 6, the storage 12 includes a 3D CAD data storage 81, a working process data storage 82, a comment information storage 83, and a selection result storage 84.

With reference to FIGS. 1 and 2, the functions and the processing flow of the working process display system of the present embodiment will be described below.

First, the three-dimensional data receiver 61 of the receiver 11 reads 3D CAD input data 20 for displaying a 3D shape of a work-target object (not shown) (Step S1). The CPU 10, more specifically the 3D modeling processor 71, carries out a modeling, such as a data processing, using a 3D CAD software based on the 3D CAD input data 20 (Step S2). With the modeling, the 3D modeling processor 71 processes and generates 3D CAD data 21. The 3D CAD data storage 81 of the storage 12 stores the 3D CAD data 21 (Step S3).

At the above steps S1 to S3 of FIG. 1, the modeling is being carried out with one 3D CAD software product. However, the modeling may be carried out with a plurality of 3D CAD software products. There may be one or two or more 3D CAD software products that carry out the modeling (Step S2).

Meanwhile, the working process data receiver 62 of the receiver 11 reads working process input data 22 (Step S4), and the CPU 10, more specifically the working process data processor 72, processes and generates working process data 23 by using working process software. The working process data storage 82 of the storage 12 stores the working process data 23 (Step S5). As the working process software, for example, Sugar (Trade Name), MS Project (Trade Name), and the like are commercially available.

Then, the CPU 10, more specifically the 3D CAD linking processor 73, carries out a 3D CAD linking based on the 3D CAD data 21 and the working process data 23 (Step S6), thereby processes or generates 3D CAD simulation data 24 that is linked to a working process. In this case, the 3D CAD linking (Step S6) is carried out on 3D CAD viewer software; the 3D CAD simulation data 24 that is linked to the working process represents the state of disassembling or assembling a device with a time axis.

The 3D CAD data 21 is used to process or generate the 3D CAD simulation data 24, that is linked to a working process, with the 3D CAD viewer software. Therefore, it is possible to see, on the 3D CAD viewer software, the back side of an object that cannot be seen from a particular point of view, as well as the positional relation with peripheral devices. Moreover, since the 3D CAD simulation data 24 is linked to the working process data 23, it is possible to confirm not only the positional relation but also temporal information, such as the timing of disassembling or assembling a device, on the 3D CAD viewer.

If point-of-view information that specifies appropriate part out of all the 3D CAD data as the 3D CAD simulation data linked to each working process has been set in advance in the working process data 23, the point-of-view information of the working process data 23 can be used, at a time when the CPU 10 processes or generates the 3D CAD simulation data 24 linked to a working process, in order to process or generate the 3D CAD simulation data 24 that is linked to a working process that is viewed from a place most suitable for a worker, for example, automatically.

The 3D CAD simulation data 24 that is linked to the working process is output as continuous image data 25.

Then, the CPU 10, more specifically the animation data processor 74, uses video processing software to process or generate 3D animation data 26 based on the image data 25 (Step S7).

The present embodiment is designed to display comment information (described later) relating to working process at an appropriate timing during the work, when animations are displayed on the display 13 based on the 3D animation data 26.

That is, comment information 27 is received via the comment information receiver 63 of the receiver 11 or a comment information database 50, which will be described later. Based on the working process data 23, the CPU 10, more specifically the working process link comment data processor 75, processes and generates comment data 28 that is linked to working process, in such a way that the comment information 27 received is linked to the working process contained in the working process data 23 (Step S8).

Then, the display 13 preliminarily displays 3D animations and comment information at the same time, based on the 3D animation data 26 and the comment data 28 (Step S9).

Then, through the comment selection receiver 64 of the receiver 11, a piece of comment information that should be displayed is selected. 3D animation/comment display data, which contains the piece of comment information that should be actually displayed and the 3D animation data 26, is processed or generated (Step S10). The piece of comment information is fixed and stored in the storage 12 (Step S11). As for the selection of the piece of comment information that should be displayed, customization is done in such a way that required, and sufficient comment information will be displayed, depending on the knowledge, experience, and competence of the workers and given a difference in the level of comment information that needs to be displayed.

After the piece of comment information that should be displayed is fixed as described above, the CPU 10, more specifically the 3D data comment linking processor 76, of the working process display system carries out a 3D CAD linking based on the 3D CAD data 21 and the fixed comment information (Step S12), and processes or generates the 3D CAD simulation data 40 that is linked to the comment. At this time, the 3D CAD linking (S12) can be conducted in such a way as to be executed on 3D CAD viewer software, as in the case where the 3D CAD simulation data 24, which is liked to a working process, is processed or generated. The 3D CAD simulation data 40 that is linked to the comment is 3D simulation data that is processed or generated in such cases as where a point-of-view position needs to be moved from a displayed image during a working process at the time of displaying the comment. There is no need to process or generate the 3D CAD simulation data 40 when it is possible to use an image displayed at the working process at the time of displaying the comment without changing the image (or without changing the point-of-view position).

The 3D CAD simulation data 40 that is processed or generated by the CPU 10, more specifically the 3D data comment linking processor 76, and is linked to the comment is embedded in an appropriate portion of the 3D CAD simulation data 24 that is linked to the working process, which chronologically shows how equipment is being disassembled or assembled. As a result, the data is turned into entire 3D CAD simulation data 41.

The entire 3D CAD simulation data 41 thus processed or generated is output as continuous image data 42.

Then, the CPU 10, more specifically the 3D animation/comment display data processor 77, processes or generates, based on the image data 42, 3D animation/comment display data 29 using video processing software (Step S13).

Then, based on the 3D animation/comment display data 29, the display 13 simultaneously displays 3D animation and the comment information (Step S14).

Thus, it is possible to simultaneously display 3D animations and the comment information, allowing workers to easily understand the working process. Moreover, necessary and sufficient comment information is displayed depending on the knowledge, the experience and the competence of the actual workers. In this manner, the information is displayed in a user-friendly and easy-to-understand manner.

Now, the comment information displayed on the display 13 and the process thereof will be described.

When a working process instruction manual (system) is being processed or generated, to a work bar that is displayed on a working process chart to show specific working processes, attributes, such as "high-place work", "heavy objects", and "precision work", are allocated. For example, in the case of working process processing software Sugar (Trade Name), the attributes can be written in a remarks column. In the case of MS Project (Trade Name), the attributes can be written in a memo column. The working process data processed or generated by the working process software is output as CSV files, not as SGR files for Sugar (Trade Name) or mpp files for MS Project (Trade Name).

When the working process data is combined with 3D CAD data on a 3D simulation software, the process data is imported in spreadsheet format, such as CSV files.

The working process display system extracts the attributes from inside the spreadsheets such as CSV files, and automatically selects only points relating to the working process from a database of comment information, and displays the points as options. A creator inserts into a 3D animation a point that he/she thinks is particularly necessary among those being displayed.

A piece of comment information to be displayed is selected by the worker himself/herself from comment information stored in a comment information database 50 (See FIG. 7) in the comment information storage 83. Accordingly, the working process display system can present information that the workers can more easily understand and more easily use in the field than any other conventional instruction manuals processed or generated by others.

For example, when display data of a portion of "turbine casing hanging-in", one of working processes in the working procedure, is processed or generated by the working process display system, "heavy objects", "equipment damage", "opening", and "jigs" are incorporated into a work bar for "turbine casing hanging-in" as attributes of working process "turbine casing hanging-in".

The working process display system extracts attributes and automatically displays comment information as options, such as "safety belts", "heavy objects", "hanging center", "interference", and "jigs", which are related to each attribution. At this time, comment information unrelated to working process "turbine casing hanging-in", such as "torque" and "temperature", is not displayed.

Figure 7:
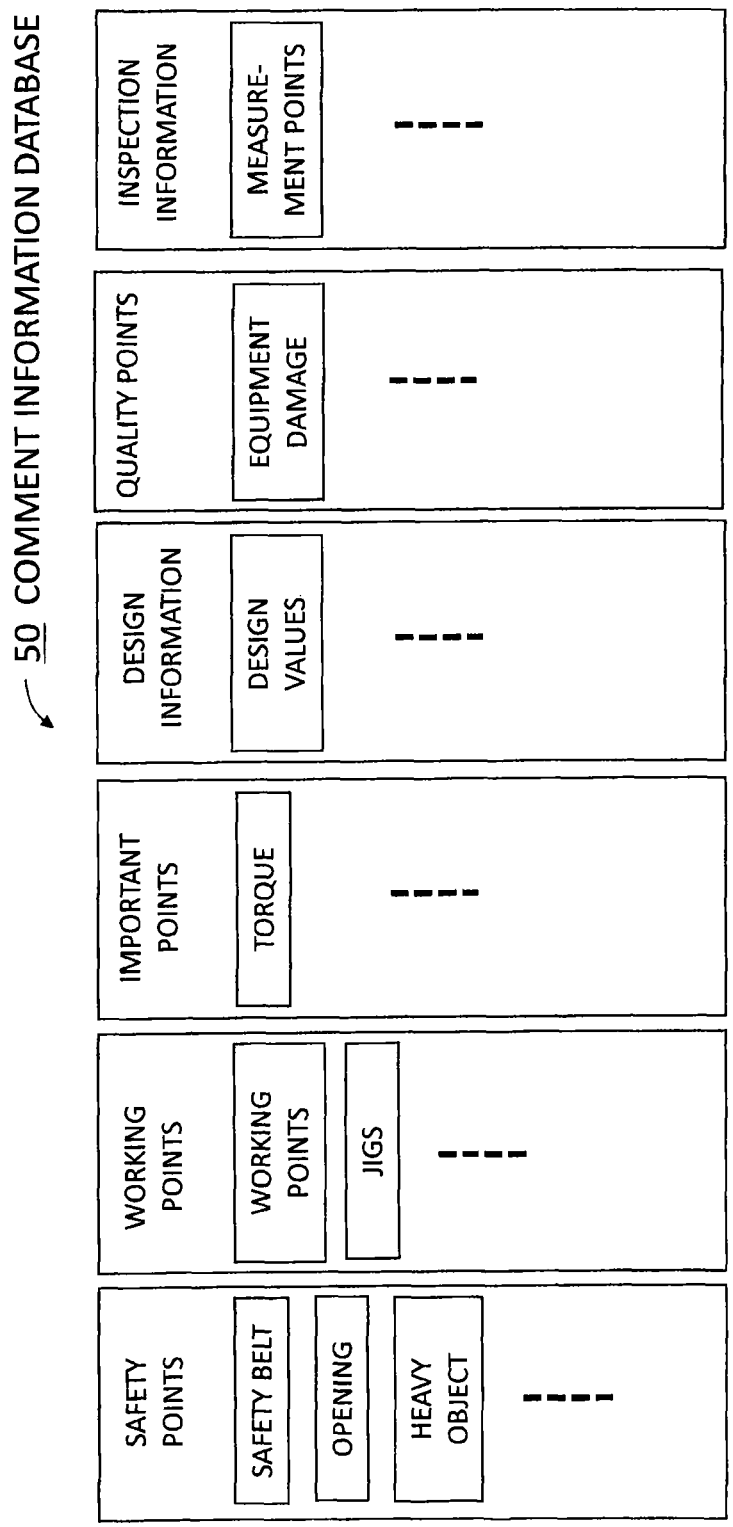
FIG. 7 is a diagram showing an example of content of the comment information database 50.

FIG. 7 is a diagram showing an example of content of the comment information database 50. The comment information is stored after being categorized into: safety points (comments on safety belts, opening, heavy objects, and the like); working points (comments on hanging center, jigs, and the like); important points (comments on torque and the like); design information (comments on design values and the like); quality points (comments on equipment damage and the like); inspection information (comments on measurement points and the like); and other categories. The way that the information is categorized into safety points, working points, important points, design information, quality points, inspection information, and the like is one that defines the method of displaying the comment information and the format. The comment information of attributes that have been categorized into the same category uses the same display type or display format. That is, in the working process display system, for example, comments of attributes that are categorized into the safety points are displayed in red and bold characters; comments of attributes that are categorized into the design information are displayed in black characters with frames. In this manner, the type or the format of displaying the comment information vary according to how the attribute of each comment is being categorized. In this manner, the way or format of displaying comments to be inserted into 3D animations vary according to the categorization information. Therefore, workers can easily recognize which category a comment being displayed on a processed or generated 3D animation belongs to.

On the comment information database 50, among the categories such as those of the safety points, working points, important points, design information, quality points, and inspection information, for example, the categories of design information and inspection information are uneditable categories in which workers cannot edit or change. As for the comment information of such an uneditable category, settings are made in such a way as not to allow a worker who is working as a creator to choose whether or not to insert into a 3D animation or edit the comment information. This configuration prevents workers from rewriting necessary comments or from making settings in such a way as not to allow displaying of the comments.

The other categories, such as those of the safety points, working points, important points, and quality points, are editable categories in which a worker who is working as a creator can choose whether or not to insert into a 3D animation or edit the comment information when necessary. In this manner, apart from the uneditable categories, the editable categories allow workers to change depending on the knowledge, experience, and competence of individual workers to achieve required and sufficient levels. Therefore, the comment information, which is inserted into 3D animations, can be made in a way that suits workers best. Furthermore, the database in which the comment information is stored may be equipped with a learning function of comment information of an editable category that is edited or selected by the worker.

In that manner, the comment information is stored after being categorized into a plurality of categories, editable and uneditable categories. Therefore, it is possible to prevent necessary information from dropping out and to process or generate a working process chart that meets the knowledge, experience, competence, and other factors of workers.

One comment or a plurality of comments can be allocated to each attribute of each category as comment information. Furthermore, on the comment information database 50, point-of-view information needed to display each comment may be defined separately from the working process data 23. In this case, when the CPU 10, more specifically the 3D CAD linking processor 73, processes or generates the 3D CAD simulation data 24 that is linked to a working process, the CPU 10 may reference not only the point-of-view information of the working process data 23 but also the point-of-view information of each comment in the database in which the comment information is stored. The comment information for each attribute will be described with reference to FIG. 8.

FIG. 8 is a conceptual diagram showing an example of comment information that is stored in such a way as to be linked to each attribute.

FIG. 8 illustrates attribute "heavy objects" in editable category "safety points". Each of detailed comments is stored in each line of a spreadsheet, and is given comment ID such as A001 or A002. Regardless of whether attributes are to be categorized into the editable or uneditable categories, a design department or the like initially needs to processes or generates comment information pertaining to each attribute in spreadsheet format. However, as for comments of attributes that are categorized into the editable categories, workers or others can add new comments with new comment IDs. As for comment information of attributes that are categorized into the uneditable categories, a new line for a new comment cannot be added. If workers or others try to add new comments on attributes that are categorized into the editable categories, comment IDs are preferably given automatically to the new comments when the new comments are added.

In columns in which each comment is stored, usage information is given on each working process, such as working process "a" and working process "b"; the usage information include point-of-view information showing how a comment corresponding to each comment ID is to be used at which working process, and an adoption ratio. Regardless of whether attributes will be categorized into editable or uneditable categories, a new working process that has never been carried out can be added as a new column of the sheet.

The point-of-view information, one piece of the usage information, is the above-described point-of-view information that is defined separately from the working process data 23 and is used when each piece of comment information is displayed. In addition to the point-of-view information, display position information, which specifies the display position of each piece of comment information at each working process, may be included.

The adoption ratio is data that represents the probability of a specific comment, which is stored in each line in such a way as to correspond to each comment ID, being actually selected and displayed at that working process, or how often the comment has been actually selected and displayed at that working process. That is, the adoption ratio is the index showing how important the comment is for that working process. As shown in FIG. 8, for example, at working process "a", the comment A001 has been displayed in 80% of construction work, and the comment A002 has been displayed in only 40% of construction work. Meanwhile, at working process "b", the comment A001 has been displayed in 20% of construction work, and the comment A002 has been displayed in 75% of construction work. In this manner, different adoption ratios have been allocated depending on the working process. As described later, as for the comment information of attributes that are categorized into the editable categories, the adoption ratio of each working process of each comment is appropriately rewritten depending on the editing situation by workers or the like. In the case of the uneditable categories, the adoption ratio of each working process of each comment is set by the design department or the like to one of two values, i.e. 1 (100%) or 0 (0%); the value cannot be rewritten depending on the editing situation by workers.

According to the present embodiment, each comment is stored in each line of the spreadsheet, and each working process is stored in each column. Instead, the comments may be stored in columns, and the working processes may be stored in lines.

The comment information that has been linked to each of the attributes that have been configured as described above is used in the working process display system as described below.

That is, after a certain working process "a" is selected, the working process display system extracts an attribute that is linked to working process "a" of the working process data, and makes a determination as to whether the attribute is categorized into the editable or uneditable categories, and reads the display type or display format that are linked to each category. Then, for example, the working process display system reads comment information that is stored in such a way as to be linked to each of the extracted attributes, such as "heavy objects", and all attributes, along with the usage information pertaining to working process "a", such as the point-of-view information and the adoption ratio. The working process display system rearranges pieces of the read comment information in descending order of adoption ratio at working process "a" before displaying in list format. When displaying the pieces of the comment information in list format, all the comments that have been read may be arranged in descending order of adoption ratio regardless of a difference in the attribution, or the comments may be arranged in order of adoption ratio after being grouped according to attribution.

Settings may be made in such a way that only comments whose adoption ratio is greater than or equal to a predetermined threshold value will be displayed in list format. In this case, particularly in the editable categories, it is possible to exclude comments that have little to do with that working process from displaying candidates.

In the uneditable categories, 100%, or 1, is stored as adoption ratio, and a corresponding comment is always displayed. Depending on the working process, it may not be necessary to display comments in all lines that are stored as comment information, and it may be enough to display only some of the comments. In such a case, as for comments that are unnecessary at each working process, the adoption ratios of the comments are set in advance by the design department or the like to 0 (0%). In this manner, it is possible to prevent the displaying of unnecessary comments that are different at each working process.

In that manner, the working process display system retrieves highly-relevant comments at each working process from the comment information database to display. In this case, the working process display system displays, based on the categorization information that has been read, a plurality of comments as options as for the comment information of attributes that are categorized into the editable categories, and the working process display system allows workers to edit.

During the editing by workers, workers can select one or a plurality of comments from a plurality of comments being listed as options; or, if workers want to add a comment that is not displayed as an option, workers can input a new comment to be received and accepted. Optionally, the working process display system may be configured to display, in list format, only categories whose adoption ratio is greater than or equal to a predetermined threshold value when displaying, in list format, comment information of attributes that are categorized into the editable categories. In this case, when workers try to input a new comment other than the listed comments to be received and accepted, the working process display system may present workers with a list of comments whose adoption ratio is less than the threshold value as options. In such a case, the workers do not have to take time to input comments, and the possibility of similar comments being stored as comment information can be reduced.

As for the comment information of attributes that are categorized into the uneditable categories, all comments whose adoption ratio is set at 100% are automatically extracted by the working process display system. Accordingly, once a worker has finished editing the comment information of attributes that are categorized into the editable categories, the comments that should be displayed for this working process are fixed. This working process is repeated at each working process. As a result, inside the working process display system, data is generated as shown in FIG. 9.

FIG. 9 is a conceptual diagram showing an example of comment data that is generated inside the working process display system. In this case, the data is in spreadsheet format for explanation. However, the format is not limited to this as long as relationships between data sets are retained as described below.

As shown in FIG. 9, for example, the comment data generated by the working process display system is generated in such a way as to contain the following information for each category and attribute: comments that workers see as necessary to display on attributes that are categorized into the editable categories at each working process such as working process "a" and working process "b"; comment IDs of all comments that are recognized as necessary to display on attributes that are categorized into the uneditable categories; and point-of-view information.

In the example of FIG. 9, for each comment ID, another information about a display position on a 3D animation image is incorporated into the comment data generated by the working process display system. In this case, the display position information may be paired with the point-of-view information of each working process in each comment of the comment information shown in FIG. 8; or alternatively, the display position information may be input by a worker when the worker edits the comment information on the working process display system, as described above.

For example, in FIG. 9, as for attribute "heavy objects" in categorization "safety points" of working process "a", it is clear that settings have been made to display comments corresponding to four comment IDs: "A001", "A004", "A013", and "A015". In this case, as for the above-mentioned four comments that are displayed for attribute "heavy objects" in category of "safety points" of working process "a", not all comments that are stored in comment information relating to attribute "heavy objects" as shown in FIG. 8 are displayed, but only some of the comments are displayed.

In that manner, after the comment data for each working process is generated in the working process display system as shown in FIG. 9, comment-display 3D CAD simulation data is generated based on the comment data. During this process, the working process display system uses the point-of-view information of the comment data of FIG. 9 as a key to rearrange the comments. The working process display system generates the comment-display 3D CAD simulation data by using a 3D viewer software or the like in such a way to allow a point of view where each comment is displayed to move smoothly.

The processed or generated comment-display 3D CAD simulation data is incorporated into an appropriate portion of the 3D CAD simulation data 24 shown in FIG. 1, before being output as continuous image data 25. In that manner, each comment is linked to the point-of-view information. From a point of view at a certain working process in the 3D CAD simulation data 24 shown in FIG. 1, a worker may have difficulty understanding a comment that is being displayed. However, by moving the point of view to an appropriate position, it is possible to present the comment to the worker in an easy-to-understand manner.

After the 3D animation where the comment is being displayed is processed or generated, the working process display system updates the comment information of attributes that are categorized into the editable categories on the comment information database. That is, as described above, when the working process display system processes or generates a 3D animation that contains comment information about a certain working process, the comment information to be displayed represents, in many cases, only some and not all of the comments stored in the comment information database. Accordingly, as for the comment information of attributes that are categorized into the editable categories of a certain working process, adoption-rate data, shown in FIG. 8, of comments adopted by the 3D animation, is updated. As a result, the information of frequently-used comments (which are high in adoption ratio) can be reflected in the comment information linked to each attribute. In this manner, a so-called learning function can be achieved.

More specifically, the selection result storage 84 memorizes, for each working process, data showing whether editable comment information has actually been selected through the comment selection receiver 64. The adoption ratio calculation processor 78 calculates the adoption ratio of comment information for each working process, based on the data stored in the selection result storage 84. Among the editable comment information for the working process, the display 13 is designed to display the comment information whose adoption ratio is greater than or equal to a predetermined threshold value, and not to display the comment information whose adoption ratio is less than the predetermined threshold value.

As for the comment information of attributes that are categorized into the uneditable categories, the display 13 is designed to display all comments that have been set in advance by the design department or the like. Therefore, the adoption-rate data is not updated.

Figure 10:
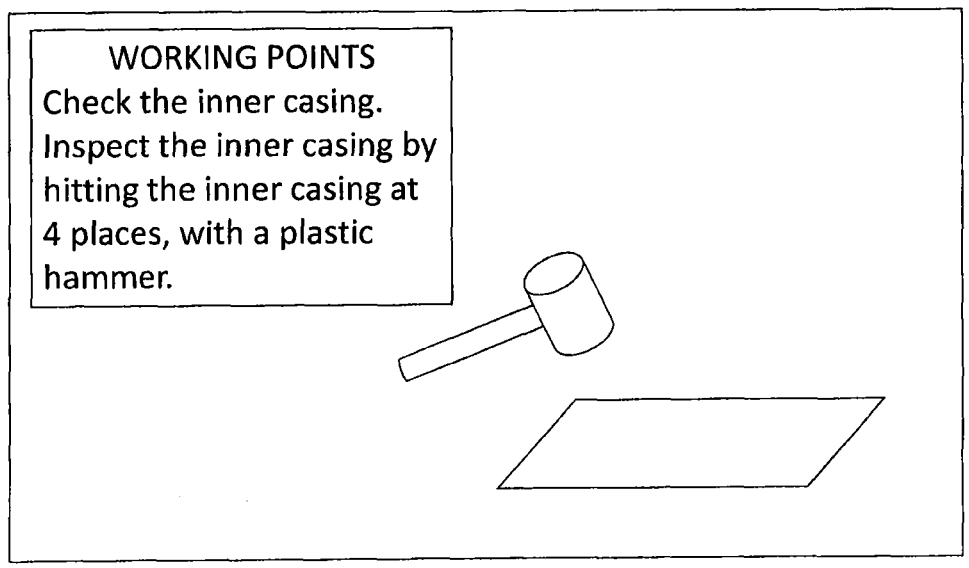
FIG. 10 is a diagram schematically showing an image display example of a 3D animation and comments.

FIG. 10 is a diagram schematically showing an image display example of a 3D animation and comments. In the example shown in the diagram, comment information that is liked to attribute "jigs" in category (editable category) "working points" of working process "turbine casing hanging-in" is being displayed on a 3D animation. In this case, in addition to the 3D animation image, the categorization information and the comment information are displayed together: "WORKING POINTS: Check the inner casing. Inspect the inner casing by hitting the inner casing at 4 places, with a plastic hammer."

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A working process processing system comprising:
processing circuitry configured to accept three-dimensional data, the three-dimensional data including a three-dimensional shape of a work-target object;
a memory which is linked with the processing circuitry and stores the three-dimensional data,
wherein the processing circuitry is further configured to:
accept working process data which chronologically defines a procedure of a plurality of working processes relating to the work-target object, the working process data containing work attribute information of each of the plurality of working processes,
accept comment data including comment information relating to the work attribute information,
store the working process data in the memory, and
process animation data based on the three-dimensional data stored in the three-dimensional data storage and the working process data processed by the processing circuitry, the animation data including displaying data showing a plurality of changing situations of the working processes;
a display which is linked with the processing circuitry and displays a three-dimensional (3D) animation based on the animation data and the comment data, wherein the 3D animation includes the comment information relating to the work attribute information of at least one of the working processes with displaying data of the respective working process of the animation data processed thereof, wherein:
the comment information includes editable comment information and uneditable comment information,
the memory stores each working process data showing whether the editable comment information is actually selected, the processing circuitry calculates an adoption ratio of each of the comment information for the respective working process based on the data stored in the memory, and the processing circuitry accepts the selection among the editable comment information of the working processes and the comment information whose adoption ratio is greater than or equal to a predetermined threshold value.

2. The working process processing system according to claim 1, wherein the processing circuitry accepts a selection of comment information relating to the respective working process, and includes the comment information with the displaying data.

3. The working process processing system according to claim 2, wherein:

the editable comment information is configured to be selected, and the uneditable comment information is configured not to be selected.

4. A working process processing method comprising:

accepting, via processing circuitry, three-dimensional data including a three-dimensional shape of a work-target object;

storing, in memory, the three-dimensional data;

accepting, via the processing circuitry, working process data which chronologically defines a procedure of a plurality of working processes relating to the work-target object, the working process data containing work attribute information of each of the plurality of working processes;

accepting, via the processing circuitry, comment data including comment information relating to the work attribute information;

storing, in memory, the working process data;

processing, via the processing circuitry, animation data based on the three-dimensional data and the working process data, the animation data including displaying data showing a plurality of changing situations of the working processes; and displaying a three-dimensional (3D) animation based on the animation data and the comment data, wherein the 3D animation includes the comment information relating to the work attribute information of at least one of the working processes with displaying data of the respective working process of the animation data processed thereof, wherein:

the comment information includes editable comment information and uneditable comment information, the memory stores each working process data showing whether the editable comment information is actually selected, the processing circuitry calculates an adoption ratio of each of the comment information for the respective working process based on the data stored in the memory, and the processing circuitry accepts the selection among the editable comment information of the working processes and the comment information whose adoption ratio is greater than or equal to a predetermined threshold value.

5. The working process processing method according to claim 4, further comprising:

accepting a selection of the comment information which relates to the respective working process, wherein the animation data includes the selection of the comment information.

6. The working process processing method according to claim 5, wherein:

the editable comment information is configured to be selected during accepting the selection of the comment information, and the uneditable comment information is configured to not be selected during accepting the selection of the comment information.

7. A working process processing system comprising:

a three-dimensional data receiver configured to accept three-dimensional data, the three-dimensional data including a three-dimensional shape of a work-target object;

a three-dimensional data storage configured to store the three-dimensional data;

a working process receiver configured to accept working process data which chronologically defines a procedure of a plurality of working processes relating to the work-target object, the working process data containing work attribute information of each of the plurality of working processes;

a comment information receiver configured to accept comment data relating to the work attribute information;

a working process data storage configured to store the working process data processed by the working process receiver;

an animation data processor configured to process animation data based on the three-dimensional data stored in the three-dimensional data storage and the working process data processed by the working process receiver, the animation data including displaying data showing a plurality of changing situations of the working processes; and a display configured to display a three-dimensional (3D) animation based on the animation data and the comment data, wherein the 3D animation includes the comment information relating to the work attribute information of at least one of the working processes with displaying data of the respective working process of the animation data processed thereof, wherein:

the comment information includes editable comment information and uneditable comment information, the working process data storage stores each working process data showing whether the editable comment information is actually selected, the comment information receiver calculates an adoption ratio of each of the comment information for the respective working process based on the data stored in the memory, and the comment information receiver accepts the selection among the editable comment information of the working processes and the comment information whose adoption ratio is greater than or equal to a predetermined threshold value.

* * * * *